United States Patent [19]

Koroschetz et al.

[11] Patent Number: 5,045,405

[45] Date of Patent: Sep. 3, 1991

[54] SLIDING SURFACE BEARING FOR HIGH LOADS

[75] Inventors: Franz Koroschetz; Walter Gartner, both of Gmunden, Austria

[73] Assignee: Miba Gleitlager Aktiengesellschaft, Laakirchen, Austria

[21] Appl. No.: 348,586

[22] PCT Filed: Jul. 22, 1988

[86] PCT No.: PCT/AT88/00054
§ 371 Date: Mar. 16, 1989
§ 102(e) Date: Mar. 16, 1989

[87] PCT Pub. No.: WO89/01094
PCT Pub. Date: Feb. 9, 1989

[30] Foreign Application Priority Data
Jul. 24, 1987 [AT] Austria ................................. 1881/87

[51] Int. Cl.$^5$ ............................................. B32B 7/02
[52] U.S. Cl. ..................................... 428/612; 428/614; 428/643; 428/644; 428/650; 428/653; 428/673; 428/674; 384/912
[58] Field of Search ........ 428/593, 612, 614, 643–647, 428/650, 652, 653, 673, 674; 384/912, 913

[56] References Cited

U.S. PATENT DOCUMENTS

| | | | |
|---|---|---|---|
| 3,941,903 | 3/1976 | Tucker | 427/190 |
| 4,404,263 | 9/1983 | Hodes et al. | 204/192.15 |
| 4,789,607 | 12/1988 | Fujita et al. | 428/653 |

OTHER PUBLICATIONS

Thornton, J. A., "Influence of Apparatus Geometry and Deposition Conditions on the Structure and Topography of Thick Sputtered Coatings", *Journal of Vacuum Science and Technology*, vol. 11, No. 4, Jul./Aug. 1974, 666–670.

Primary Examiner—R. Dean
Assistant Examiner—George Wyszomierski
Attorney, Agent, or Firm—Kurt Kelman

[57] ABSTRACT

In a sliding surface bearing for high loads, comprising a sliding layer (2), which has physically been applied in a vacuum directly to a bearing metal layer (1) and consists of a base material with finely divided inclusions (6), which are substantially insoluble in the base material at the operating temperature, substantial freedom from wear and a minimum tendency to mixing by rubbing are to be ensured in that all inclusions (6) have a lower hardness than the base material, which has been crystallized to form columns having a preferred orientation at right angles to the sliding surface (4).

12 Claims, 1 Drawing Sheet

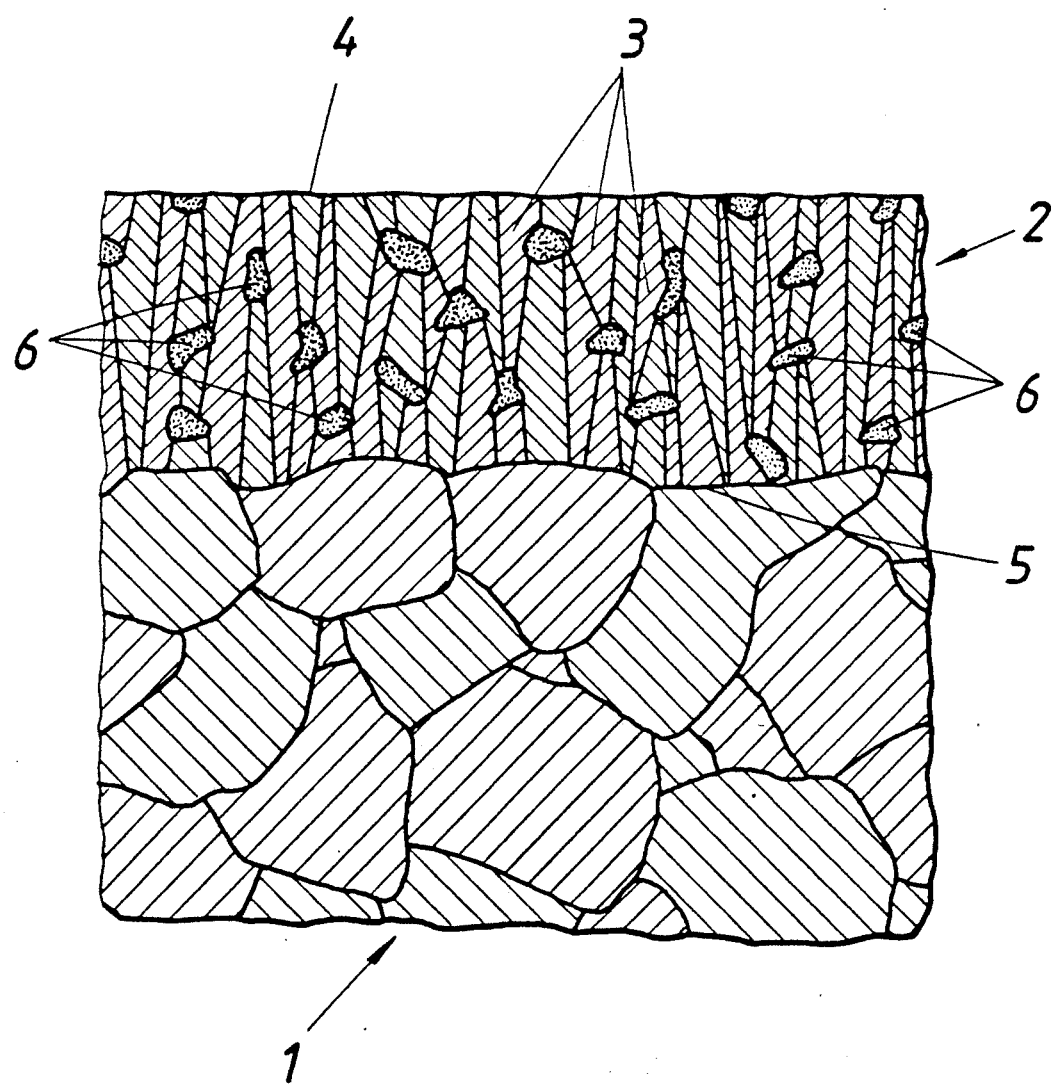

SLIDING SURFACE BEARING FOR HIGH LOADS

This invention relates to a sliding surface bearing for high loads, comprising a metal alloy sliding layer, which has physically been applied in a vacuum directly to a metal alloy carrier, particularly to a bearing metal layer, and comprises a base material that contains finely divided particles, which are at least substantially insoluble in the base material at a predetermined operating temperature for which the bearing has been designed.

In conventional sliding surface bearings for heavy loads, an interlayer usually made of nickel is provided between the electrodeposited lead- or tin-base sliding layer which constitutes the sliding surface and the bearing metal layer which carries the sliding layer. That interlayer is intended to ensure an adequate adhesion of the sliding layer to bearing metal layers consisting of an aluminum layer and in case of bearing metal layers made of lead bronze will prevent a diffusion so that a formation of brittle intermetallic phases will be avoided at the operating temperature. Because a premature wear of the soft sliding layer must be expected under heavy loads, e.g., owing to high peak pressures on the lubricating film and small lubricating gaps, elevated operating temperatures or contaminated and aged lubricating oils, there is a risk that the hard interlayer will become exposed at least in part so that the risk of failure will suddenly increase because that interlayer is harder than the bearing metal layer and has no emergency running properties. Besides, the tribological properties of the sliding layer will be deteriorated by a depletion of tin and/or copper owing to $(CuNi)_xSn_y$ phases forming between the sliding layer and the nickel interlayer owing to the known diffusion phenomena.

It is known (German Patent Specification 28 53 724) that the mechanical strength and the wear at elevated temperature can be increased by a formation of metallic sliding or friction layers of a dispersion-hardened composite material by cathode sputtering with a provision of non-metallic inclusions which are very finely divided in soft metallic base material as uniformly as possible. If such dispersion-hardened composite materials are used as a sliding layer of a sliding surface bearing, it will be recommendable to provide an interlayer. Besides, such sliding layers owing to their higher hardness will attack the softer shaft although this must generally be avoided. For these reasons such dipersion-hardened composite materials are not suitable as a sliding layer for sliding surface bearings for high loads.

For this reason it is an object of the invention to provide a sliding surface bearing for high loads, which in spite of having a comparatively soft sliding layer will remain substantially free of wear and unsusceptible to disturbances for the required service life and which will form a sliding surface which has only a minimum tendency to exhibit a mixing by rubbing.

In a sliding surface bearing for high loads which is of the kind described first hereinbefore the invention accomplishes the object set forth in that the particles embedded in the base material have a lower hardness than the base material and a mean particle diameter below 3 $\mu$m, the base material of the sliding layer has been crystallized in the form of columns having a preferred orientation at right angles to the sliding surface, and the alloying constituents of the metal alloy of the carrier and of the sliding layer consist of metals which do not form intermetallic compounds at the operating temperature.

Because the crystallites of the base material of the sliding layer are columnar and oriented substantially at right angles to the sliding surface, the wear resistance and the compressive strength of the sliding layer are increased whereas its hardness, which is determined by the exclusively softer embedded particles and by the size of the crystallites of the base material, will not be influenced. Owing to the required fine division of the softer embedded particles in the base material of the sliding layer, to the upper limit to their particle size and to the fact that the diameters of the columnar crystallites of the base material desirably match that particle size limit, there will be mixing action between the base material and the embedded particles even in closely defined local regions so that there will be a very low affinity to the shaft material and, as a result, a very low tendency to exhibit a mixing by rubbing. The fine distribution of the inclusions, which have a mean particle diameter not in excess of 3 $\mu$m and a melting point above the highest operating temperature to be expected, the fatigue strength will be desirably high even at relatively high operating temperatures of 170° to 200° C.

Because the main alloying constituents of the metal alloy of the carrier, which generally constitutes a bearing metal layer, and of the sliding surface consist of metals which will not form intermetallic compounds at the operating temperature, there will be no need for an interlayer as a diffusion barrier between the sliding layer and the carrier. Such an interlayer is also not required as a primer because owing to the orientation of the columnar crystallites of the base material at right angles to the sliding surface, i.e., at right angles to the surface of the carrier, a suitable cleaning of the surface of the carrier to leave no residue will result in an effective interlocking of the sliding surface and the carrier by the atoms which penetrate into the surface of the carrier at right angles thereto as the sliding layer is built up. As a result, the interlayer may be omitted and that omission will not result in the disadvantages otherwise expected the advantage will be obtained that the emergency running properties of the bearing metal layer serving as a carrier will be effective when the sliding layer has entirely been worn away.

In order to preclude in a simple manner a formation of intermetallic compounds between the main alloying constituents of the metal alloy of the carrier and the sliding layer, the base material of the sliding layer metal alloy may have the same main alloying constituent as that of the carrier. Because the embedded particles are insoluble in the base material at the operating temperature, an interaction between the softer embedded particles of the sliding layer and the bearing metal layer serving as the carrier will also be precluded.

If the metal alloy of the carrier and the sliding layer have different main alloying constituents, the formation of intermetallic compounds at the operating temperature will reliably be avoided if the melting points of the main alloying constituents have a temperature that is at least three times the operating temperature because in that case the energy of formation of such intermetallic phases will not be available at the operating temperature.

In accordance with a further feature of the invention the interfacial zone of the sliding layer adjacent to the carrier may be at least substantially free of embedded particles so that disturbing diffusion phenomena involving embedded particles in the base material of the sliding layer will effectively be avoided. That interfacial zone may have a thickness, e.g., of 0.01 to 0.1 μm but that thickness will not be significant because the embedded particles are not soluble in the base material at the existing operating temperatures.

In special cases the strength of the bearing metal layer which carries the sliding layer will not be sufficient for taking up the loads to be expected. In such cases the bearing layer may directly be applied to the backing shell of steel, which will then serve as a carrier, because the low susceptibility of the sliding layer to wear will minimize the risk of an exposure of portions of the backing shell of steel.

The requirements set forth will be met by bearing layers and carriers consisting of metal alloys in which the main alloying constituent consists of a aluminum, copper, iron, nickel or silver. Whereas plastics might be used for the soft embedded particles in the base material of the sliding layer, particularly desirable conditions will be obtained if the softer embedded particles consist of a metal, such as tin, lead or bismuth, because metallic embedded particles will ensure an improved dissipation of heat.

As regards the content of the softer embedded particles in the volume of the sliding layer a lower limit is imposed by the requirement to minimize the tendency of the sliding layer to mixing and rubbing and a higher limit will be imposed by the required minimum strength. If the volume content of the softer embedded particles is 5 to 45%, the requirements regarding the tendency to mixing by rubbing will satisfactorily be met under the usual loads and conditions of mixed frictions. But as regards the strength properties, the density of the main alloying constituent of the base material metal alloy of the sliding layer must be taken into account. For this reason in a sliding layer which contains aluminum as a main alloying constituent the softer embedded particles shall not exceed 20% by volume. In a sliding layer base material metal alloy whose main alloying constituent consists of copper or silver, the softer embedded particles may desirable amount to 15 to 40% by volume.

If the sliding layer has at least substantially the same hardness as the carrier, a high carrying capacity of the sliding surface bearing will be ensured and the risk of a failure in case of a wear-induced transition from the sliding layer to the bearing metal layer which constitutes the carrier will be reduced.

BRIEF DESCRIPTION OF THE DRAWING

The subject matter of the invention is illustrated by way of example on the drawing, which is a diagrammatic sectional view showing a sliding surface bearing in accordance with the invention viewed on a surface through the sliding layer that has been applied to a carrier.

The illustrated sliding surface bearing essentially consists of a carrier 1 made of a bearing metal layer, which has optionally been applied to a backing shell of steel, not shown, and a sliding layer 2, which has physically been applied in a vacuum to that bearing metal layer and is composed of a base material having columnar crystallites 3, which extend substantially at right angles to the sliding surface 4 and/or to the interface 5 between the sliding layer 2 and the bearing metal layer 1. In that base material which has been crystallized in columnar form, finely divided embedded particles having a mean particle diameter not in excess of 3 μm are embedded and are all softer than the base material. As a result, even in closely confined local regions the tribological properties of the sliding layer will not be determined only by the base material or only by the embedded particles 6 but will be determined by the base material and by the embedded particles. The crystallities 3 are columnar because the atoms have been applied in a direction which is at right angles to the interface 5 and under certain temperature and pressure conditions as is known per se in cathode sputtering. The cathode sputtering is effected, e.g., with the target material at a temperature of about 80° C. and under an argon pressure of about $2 \times 10^{-3}$ millibars and with the bearing metal layer disposed coaxially to the rod cathode and kept at a constant temperature which is, e.g., one-half of the absolute temperature of the melting point of the base material.

Before that coating of the bearing metal layer 1 with the sliding layer, the surface of the bearing metal layer must be kept to leave no residue and the surface oxide layer must be removed, e.g., by an ion bombardment in a gas discharge, and/or the surface of the bearing metal must be activated in order to ensure a desired bond strength between the sliding layer and the bearing metal layer.

For instance, if a sliding layer 2 made of AlPb30 is to be applied by the described cathode sputtering process to a bearing metal layer 1 made of AlZn74.5SiCuPbMg, corresponding rings made of lead and aluminum may be applied in a suitable sequence to the cathode and an axial relative movement between the cathode and the bearing metal layer may be effected during the sputtering so that the aluminum will be crystallized in columnar form on the bearing metal layer 1 with a preferred orientation which is at right angles to the sliding surface 4 and the softer lead may be included in that base material in a very fine division and with a volume content of about 9.5%. The diameter of the columnar crystals 3 corresponds approximately to the mean particle diameter of the embedded particles 6 and will be determined by the pressure and temperature conditions during the sputtering process. The sliding layer shall have a thickness between 5 and 30 μm, preferably between 8 and 16 μm. If the diameter of the embedded particles exceeds one-half of the thickness of the layer, the strength will decrease very quickly. Because the tendency to mixing by rubbing will decrease very quickly. Because the tendency to mixing by rubbing will decrease as the embedded particles are more finely divided in the base material, a comparatively small diameter of the embedded particles 6 and of the crystallites 3 will be desired. Particularly favorable conditions will be achieved with mean diameters between 0.1 and 1.5 μm.

In another example, a sliding layer of AlSn20 is to be applied to a bearing metal layer made of AlZn4.5MgZr. In that case, target rings made of AlSn20 may be cast for the cathode sputtering. In such a sliding layer the content of the softer embedded particles of tin will amount to about 8.5% by volume. That sliding layer will be preferable to a sliding layer made of AlPb30 if corrosive lubricating oils are employed.

For special loads, the bearing metal layer 1 made of aluminum may be replaced by a cast lead bronze CuPb22Sn and no interlayer serving as a diffusion barrier will be required in that case if care is taken that substantially no softer embedded particles are contained in the interfacial zone of the sliding layer 2. That requirement can be met in a simple manner in that the target materials are properly arranged on the cathode and a relative movement is imparted to the cathode and the bearing metal layer at the same time. The thickness of the particle-free boundary zone is of minor significance because the embedded particles are not soluble in the base material of the sliding layer.

If a sliding surface bearing is to be made which is particularly insusceptible to mixing by rubbing and suitable for high loads, a sliding layer of AgPb35 may be applied to a cast lead bronze CuPb22Sn and the silver and lead may be applied to the cathode as separate rings. In that case the volume content of the softer lead embedded particles will amount to about 33% by volume.

If a high resistance to wear by abrasive particles in the lubricating oil is desired, a sliding layer made of CuPb30 on a bearing meal layer made of AlZn4.5 or CuPb22Sn will be particularly desirable. Target rings made of CuPb30 may be cast for the cathode sputtering and may be applied to the cathode. The lead content in the sliding layer will amount to about 25% by volume.

Instead of lead, bismuth may be used as a soft material in a base material of silver of copper.

It will be understood that the invention is not restricted to the illustrative embodiments which have been described. For instance, the sliding layer may be applied to the bearing metal layer by a process other than cathode sputtering, e.g., by ion cladding, because it is mainly essential to provide the described columnar crystallites of the base material of the sliding layer and the softer embedded particles finely divided therein than to use a specific manufacturing For special load conditions, a bearing metal layer may be omitted and the bearing layer may directly be applied to a carrier 1 consisting of the backing shell of steel.

We claim:

1. A sliding surface bearing for high loads and designed for operation at a maximum operating temperature, which comprises
(a) a carrier comprised of a metal alloy including a main alloying constituent which is more than 50% by weight of the carrier, and
(b) a sliding layer physically applied in a vacuum directly to the carrier, the sliding layer being comprised of
   (1) a metal alloy base material including a main alloying constituent which is more than 50% by weight of the sliding layer, and crystallized in the form of columns having a preferred orientation at right angles to the sliding surface, the main alloying constituents of the metal alloys of the carrier and of the base material being metals which do not form intermetallic compounds at the operating temperature, and
   (2) finely divided particles embedded in the base material, the embedded particles being at least substantially insoluble in the base material at the operating temperature and having a lower hardness than the base material and a mean particle diameter below 3 μm; and
wherein the volume content of the particles embedded in the sliding layer base material amounts to 5% to 45%.

2. The sliding surface bearing of claim 1, wherein the metal alloys of the carrier and the sliding surface base material have the same main alloying constituent.

3. The sliding surface bearing of claim 1, wherein the metal alloys of the carrier and the sliding surface base material have different main alloying constituents and the melting points of the main alloying constituents are at least three times the operating temperature.

4. The sliding surface bearing of claim 3, wherein the carrier and the sliding surface define an interfacial zone therebetween and the interfacial zone is at least substantially free of the embedded particles.

5. The sliding surface bearing of claim 1, wherein the carrier consists of a backing shell of steel.

6. The sliding surface bearing of claim 1, wherein the main alloying constituent of the metal alloy of the sliding layer base material is a metal selected from the group consisting of aluminum, copper, iron, nickel and silver.

7. The sliding surface bearing of claim 1, wherein the main alloying constituent of the metal alloy of the carrier is a metal selected from the group consisting of aluminum, copper, iron, nickel and silver.

8. The sliding surface bearing of claim 1, wherein the embedded particles consist of a metal selected from the group consisting of tin, lead and bismuth.

9. The sliding surface bearing of claim 1, wherein the main alloying constituent of the metal alloy of the sliding layer base material is aluminum and the volume content of the particles embedded therein does not exceed 20%.

10. The sliding surface bearing of claim 1, wherein the sliding layer has at least substantially the same hardness as the carrier.

11. A sliding surface bearing for high loads and designed for operation at a maximum operating temperature, which comprises
(a) a carrier comprised of a metal alloy including a main alloying constituent which is more than 50% by weight of the carrier, and
(b) a sliding layer physically applied in a vacuum directly to the carrier, the sliding layer being comprised of
   (1) a metal alloy base material including a main alloying constituent which is more than 50% by weight of the sliding layer, and crystallized in the form of columns having a preferred orientation at right angles to the sliding surface, the main alloying constituents of the metal alloys of the carrier and of the base material being metals which do not form intermetallic compounds at the operating temperature;
   (2) finely divided particles embedded in the base material, the embedded particles being at least substantially insoluble in the base material at the operating temperature and having a lower hardness than the base material and a mean particle diameter below 3 μm; and
wherein the main alloying constituent of the metal alloy of the sliding layer base material is a metal selected from the group consisting of copper and silver, and the volume content of the particles embedded therein amounts to 15% to 40%.

12. A sliding surface bearing for high loads and designed for operation at a maximum operating temperature, which comprises
(a) a carrier comprised of a metal alloy including a main alloying constituent which is more than 50% by weight of the carrier; and (b) a sliding layer physically applied in a vacuum directly to the carrier, the sliding layer being comprised of
   (1) a metal alloy base material including a main alloying constituent which is more than 50% by weight of the sliding layer, and crystallized in the form of columns having a preferred orientation at right angles to the sliding surface, the main alloying constituents of the metal alloys of the carrier and of the base material being metals which do not form intermetallic compounds at the operating temperature, and
   (2) finely divided particles embedded in the base material, the embedded particles being at least substantially insoluble in the base material at the operating temperature and having a lower hardness than the base material and a mean particle diameter below 3 $\mu$m;
wherein the volume content of the particles embedded in the sliding layer base material amounts to 5% to 45%;
wherein the metal alloys of the carrier and the sliding surface base material have different main alloying constituents and the melting points of the main alloying constituents are at least three times the operating temperature; and
wherein in the carrier and the sliding surface define an interfacial zone therebetween and the interfacial zone is at least substantially free of the embedded particles.

* * * * *